(12) United States Patent
Said

(10) Patent No.: US 8,531,822 B2
(45) Date of Patent: Sep. 10, 2013

(54) COOLING AND CONTROLLING ELECTRONICS

(75) Inventor: Waleed M. Said, Rockford, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 247 days.

(21) Appl. No.: 13/193,743

(22) Filed: Jul. 29, 2011

(65) Prior Publication Data

US 2013/0027848 A1    Jan. 31, 2013

(51) Int. Cl.
*H05K 7/20* (2006.01)

(52) U.S. Cl.
USPC .......................................... 361/677; 361/699

(58) Field of Classification Search
USPC ................................................. 361/676–677
See application file for complete search history.

(56) References Cited

U.S. PATENT DOCUMENTS

| | | | |
|---|---|---|---|
| 3,749,981 A * | 7/1973 | Koltuniak et al. | 361/696 |
| 4,631,573 A | 12/1986 | Sutrina | |
| 4,765,387 A | 8/1988 | Mannen | |
| 5,088,005 A | 2/1992 | Ciaccio | |
| 5,111,280 A | 5/1992 | Iversen | |
| 5,349,498 A | 9/1994 | Tanzer et al. | |
| 5,353,192 A | 10/1994 | Nordin | |
| 5,655,381 A * | 8/1997 | Huttenlocher et al. | 62/259.2 |
| 6,213,195 B1 | 4/2001 | Downing et al. | |
| 7,061,766 B2 | 6/2006 | Wainwright et al. | |
| 7,450,388 B2 * | 11/2008 | Beihoff et al. | 361/715 |
| 7,710,228 B2 | 5/2010 | Feng et al. | |
| 7,864,506 B2 | 1/2011 | Pal et al. | |
| 8,081,423 B2 * | 12/2011 | Pereira et al. | 361/676 |
| 2003/0011988 A1 * | 1/2003 | Irmer | 361/690 |
| 2011/0110021 A1 * | 5/2011 | Vanhyfte et al. | 361/608 |
| 2012/0176732 A1 * | 7/2012 | Cosley et al. | 361/622 |

* cited by examiner

Primary Examiner — Gregory Thompson
(74) Attorney, Agent, or Firm — Carlson, Gaskey & Olds, PC

(57) ABSTRACT

A power electronics rack includes a switching chamber provided with one or more plate heat exchangers to receive a cooling fluid. A contactor chamber has contactors for connecting switches in the switching chamber to a magnetics chamber. The magnetics chamber receives at least one of a filter, an inductor or a transformer. The magnetics chamber receives cooling fluid which directly contacts the at least one of a filter, an inductor and a transformer for cooling. A common cooling circuit delivers cooling fluid to both the switching and magnetics chambers. The contactors may be reconfigured under certain conditions.

15 Claims, 3 Drawing Sheets

COOLING AND CONTROLLING ELECTRONICS

BACKGROUND

This application relates to mounting, cooling and controlling a number of distinct types of power electronic circuits interconnected to form unique functions such as motor controllers in a common rack.

Motor controllers typically include a number of functions, namely, 1) a power conversion function, 2) a control function, 3) a filter magnetics function and 4) a thermal management function.

The power conversion function contains a number of different components built around the power switching devices. The control function commands the power switches in the conversion function to operate at certain frequencies and modes to achieve power conversion. The switching of high voltage and currents at high frequencies in the conversion function is accompanied by electromagnetic noise and power quality effects necessitating the filtering function in the motor controller. The filters include inductors, transformers and other magnetic structures. The conversion function and the filtering function dissipate significant amount of heat that the thermal management function must control. In the conversion function, the power switching devices are the most power dissipative and therefore require carefully designed thermal management techniques.

These power devices with their thin structures and flat thermally conductive baseplates lend themselves to cold plate cooling. A cold plate typically is a heat exchanger that receives a circulating cooling fluid.

However, transformers, filters or inductors, have a relatively large height, and thus are not adequately cooled by cold plates. Such systems are often cooled by a flooded chamber, or spray cooling of a fluid.

In addition, in general, all of the several functions in the motor controllers have been housed within a single unit. Thus, it has not been possible to provide optimum cooling. Instead, the combined systems have all typically been cooled by one cooling method or the other (cold plate or submerged/sprayed) and not combined.

SUMMARY

A power electronics rack includes a switching chamber provided with one or more plate heat exchangers to receive a cooling fluid. A contactor chamber has contactors for connecting switches in the switching chamber to a magnetics chamber. The magnetics chamber receives at least one of a filter, an inductor or a transformer. The magnetics chamber receives cooling fluid which directly contacts the at least one of a filter, an inductor and a transformer for cooling. A common cooling circuit delivers cooling fluid to both the switching and magnetics chambers.

In a second feature, the contactors can be changed to selectively connect power converters to motors in alternative arrangements. A method is also disclosed.

These and other features of the present invention can be best understood from the following specification and drawings, of which the following is a brief description.

DETAILED DESCRIPTION OF EMBODIMENTS

Figure 1:
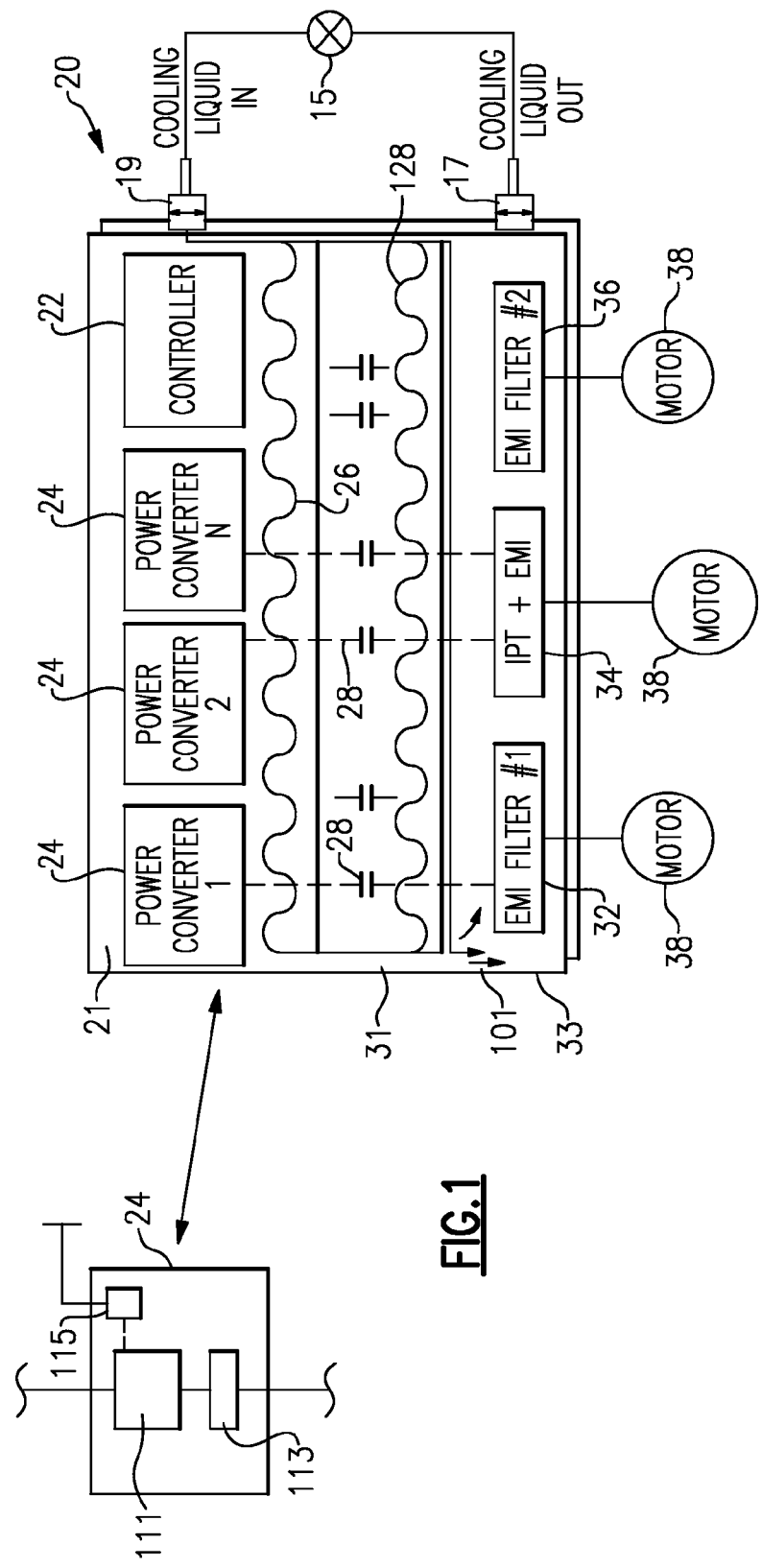
FIG. 1 schematically shows a power electronics rack.

FIG. 1 shows a power electronics rack 20. As shown, a cooling liquid inlet 19 delivers cooling fluid into the rack 20, while an outlet 17 moves the cooling liquid out. A pump 15 is shown schematically, and may move cooling fluid from the outlet 17 to the inlet 19, and may cool the cooling fluid such as with an intermediate heat exchanger—not shown.

Within the rack 20, there are several chambers illustrated. The first chamber 21, a conversion chamber, receives power converters 24 and controller 22. For purposes of this application, the power converters 24 will come under the broad definition of "converter." As mentioned above, these are relatively thin electronic elements, and thus are well cooled by a cold plate 26. The cold plate 26 is shown schematically, and essentially is a heat exchanger, or a series of heat exchangers that have internal passages for circulating cooling fluid.

Another chamber, a contactor chamber, shown at 31, receives a plurality of contactors 28. These may be solid state contactors and serve to connect the converters 24 found in chamber 21, to the appropriate magnetic devices such as filters and transformers such as found in a chamber 33. This will be explained below. The contactor chamber 31 is also shown with a cold plate 128, as another heat exchanger. Alternatively, the contactors 28 may simply be cooled passively if their dissipation proves to be unsubstantial.

After leaving the cold plates 26 and 128, the cooling fluid flows into a chamber 33, a magnetics chamber, which includes filters 32 and 36, or inductor/transformers 34. This chamber may be flooded or spray cooled as shown at 101. These components eventually drive motors 38.

Figure 2:
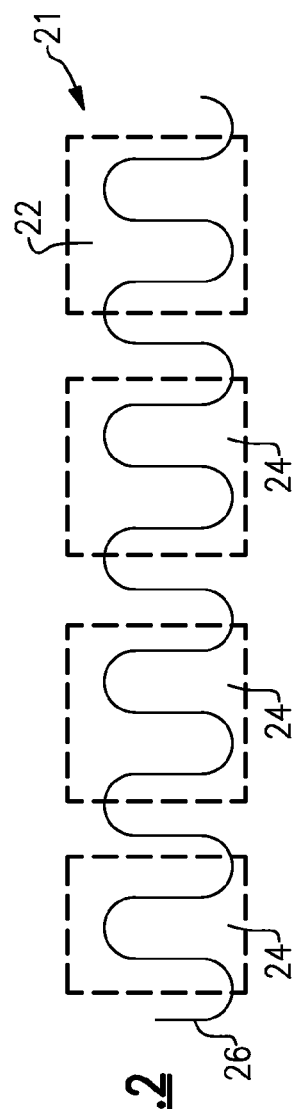
FIG. 2 shows one portion of the FIG. 1 embodiment.

As shown in FIG. 2, the cold plates may be essentially a circulating path for the fluid as shown in 26 which passes under the power converters 24 and control 22.

In this manner, a modular rack can be provided to cool the main components of a system for providing power to motors. The use of the cold plates and the flooded or spray cooling, in combination, allows cooling of the distinct types of electronics for motor control with different cooling techniques all within a common rack.

As can be seen in FIG. 1, motor control electronics which were previously combined have been partitioned into a conversion portion, a contactor portion, and a magnetic portion in separate chambers 21, 31, 33 as set forth above. In this way, individual cooling schemes which are best suited for each of the individual components can be provided.

As can be appreciated, there would be provision in the rack 20 for the modular mounting of any number of power converters 24, and there would be sufficient contactors 28 to connect those power converters to appropriate components in the magnetics chamber 33. The use of the contactors 28 in combination with the power converters 24, and the filters in the magnetics chamber 33, allows the building of a rack 20 that is designed and structured to meet any requirement for mounting and cooling a power electronics system for certain number of motors.

With this partitioning approach, another feature that allows summing a number of converters in parallel and channeling the outputs to an IPT+EMI (Interphase Transformer plus EMI Filter) magnetics 34 to drive a larger power rating motor can be realized. This feature is shown, for example, across FIGS. 3 and 4.

Figure 3:
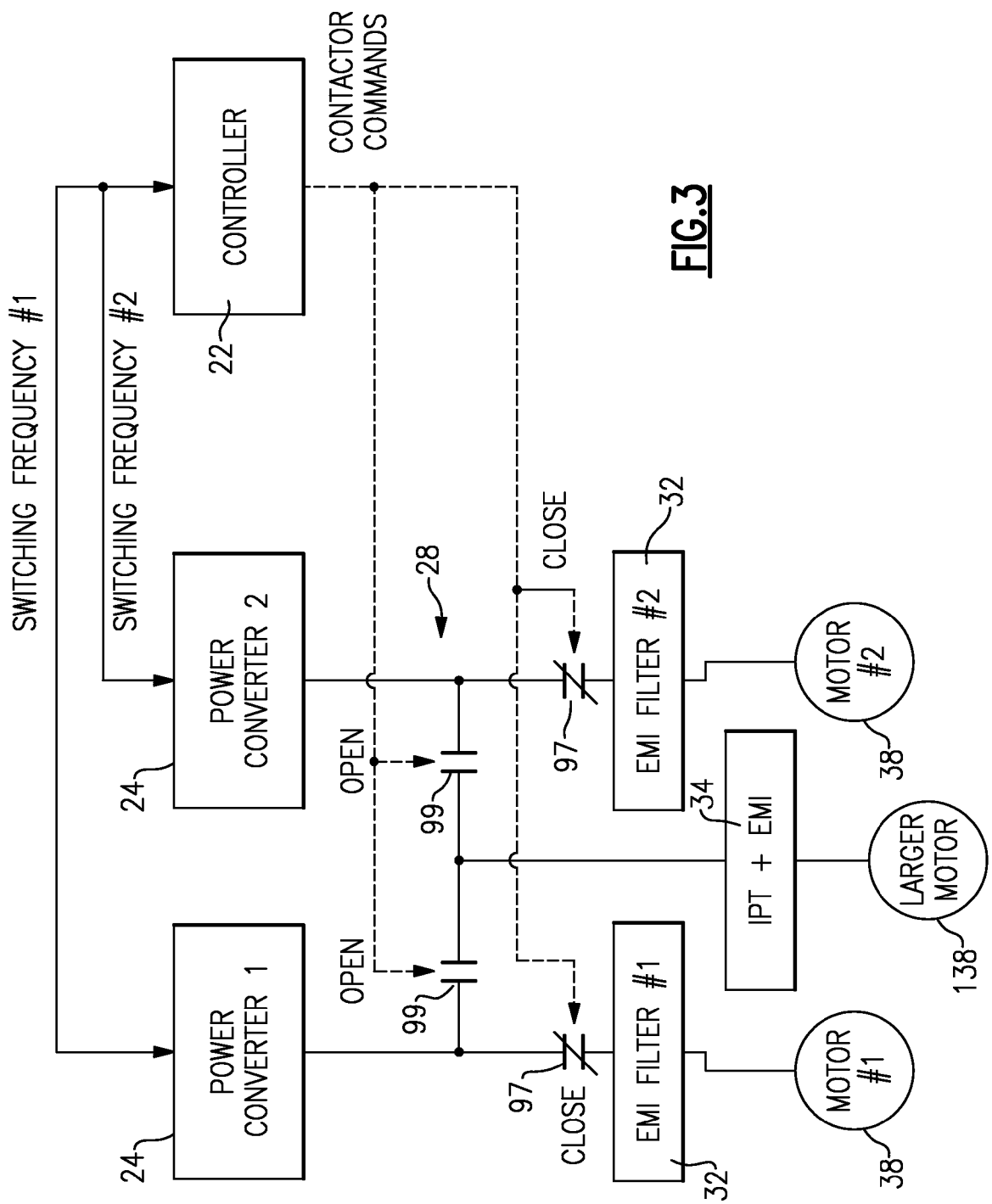
FIG. 3 shows another feature of the present invention.

As shown in FIG. 3, two power converters 24 are controlled by the controller 22, and supply power to individual motors 38 through contactors 97 and/or 99 and EMI filters 32. Thus, the power converter 24 shown to the left-hand side has power passing through a closed contactor 97, while a second contactor 99 is open. The controller 22 controls the contactors 97 and 99. The right-hand side power converter 24 delivers power to a motor 38 in a similar fashion.

Figure 4:
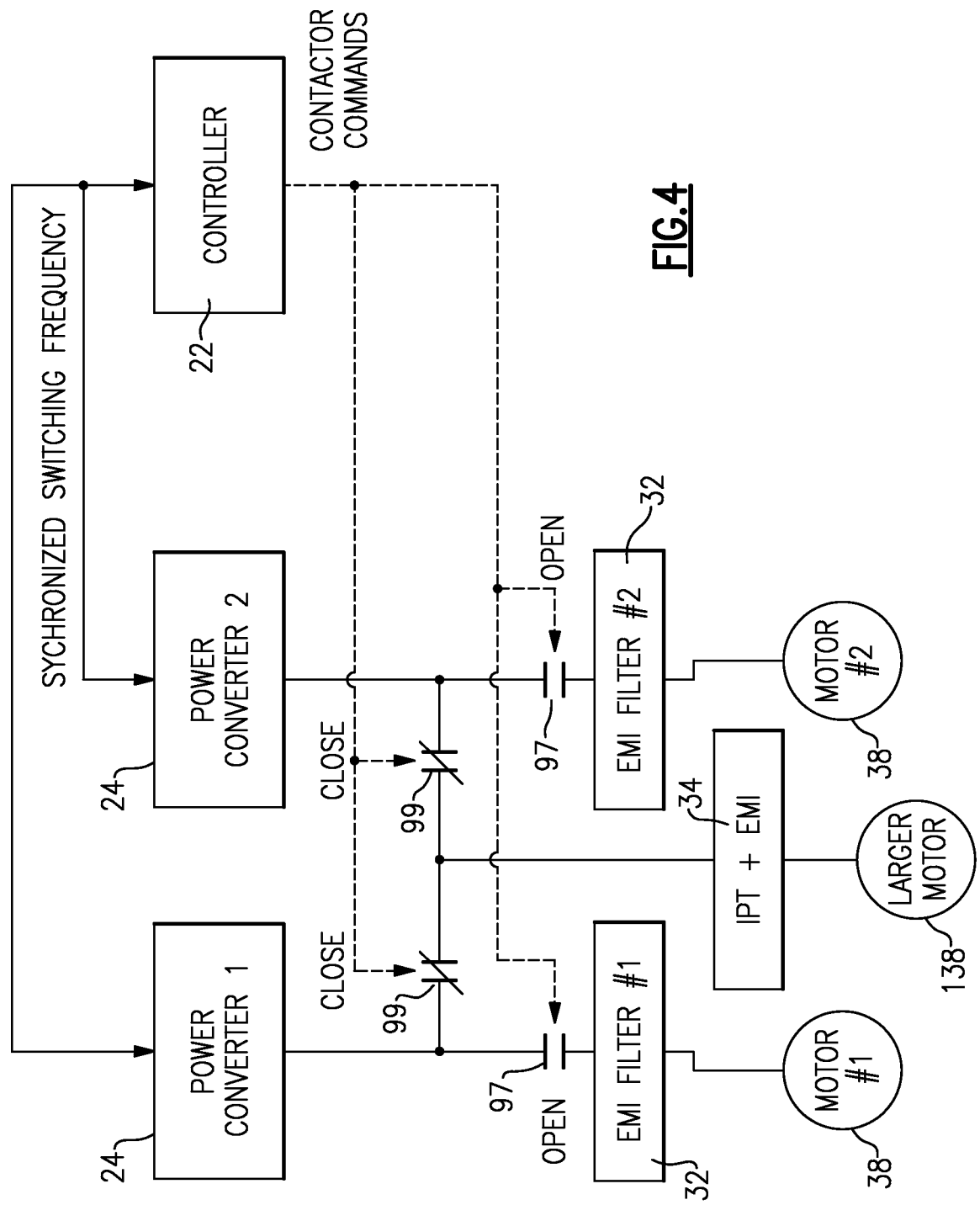
FIG. 4 shows yet another feature.

As shown in FIG. 4, the power converters 24 can be combined to supply power to a larger motor 138 under certain conditions. In this scenario, the controller 22 closes the contactors 99, and opens contactors 97. Now, both power converters 24 deliver power through an interphase transformer and EMI filter 34 to the larger motor 138. For the purpose of correctly summing the power in converters 24, FIG. 4 also shows that controller 22 sends a synchronized switching frequency to both converters 24.

It should be understood that the power converter 24 as partitioned in this embodiment would typically include a power converter switch 111, a storage member 113 such as a capacitor, and a gate drive control 115 to communicate and receive control signals from the controller 22. The contactors 28, 97, 99 would be a contactor switch which may be selective as shown in FIGS. 3 and 4, or could simply be a simple contactor. The contactors 28, 97, 99 could be conventional electromagnetic or of the solid state electronic type. The magnetics would include various components as set forth in this application, or other magnetic components.

An embodiment has been disclosed, however, a worker of ordinary skill in the art would recognize that certain modifications which come within the scope of these concepts. Thus, the following claims should be studied to determine the true scope and content.

What is claimed is:

1. A power electronics rack comprising:
a switch chamber having switches and a heat exchanger to receive a cooling fluid;
a contactor chamber having contactors for connecting the switches in the switch chamber to components in a magnetics chamber, and said magnetics chamber components including at least one of a filter, an inductor or a transformer, and said magnetics chamber receiving said cooling fluid which directly contacts said at least one of a filter, an inductor and a transformer for cooling; and
a common cooling circuit for delivering said cooling fluid to said heat exchanger, and for directly contacting said at least one of a filter, an inductor and a transformer.

2. The power electronics rack as set forth in claim 1, wherein there are provisions to receive a plurality of switches in the switch chamber, and said contactors connecting said switches to one or more of the components in the magnetics chamber.

3. The power electronics rack as set forth in claim 1, wherein a controller for the switches is mounted in the switch chamber.

4. A power electronics rack as set forth in claim 1, wherein said cooling fluid exits the heat exchanger and then is delivered directly into the magnetics chamber.

5. The power electronics rack as set forth in claim 4, wherein said cooling fluid is sprayed directly onto the components in the magnetics chamber.

6. The power electronics rack as set forth in claim 4, wherein said magnetics chamber is flooded with said cooling fluid.

7. The power electronics rack as set forth in claim 1, wherein said contactor chamber is also provided with a heat exchanger.

8. The power electronics rack as set forth in claim 1, wherein said switches in said switch chamber generally include a switch, a storage system, and a gate drive to communicate and receive signals from a controller.

9. The power electronics rack as set forth in claim 8, wherein said controller is mounted in said switch chamber.

10. The power electronics rack as set forth in claim 1, wherein said contactor chamber includes selective contactors such that a controller can actuate to reconfigure the provision of power to components in the magnetics chamber from the switches based upon a particular need.

11. The power electronics rack as set forth in claim 10, wherein said contactors can selectively connect a switch in the switch chamber directly to a first lower power motor, and can combine a plurality of the switches in the switch chamber to a single, larger motor to provide adequate power.

12. A power electronics rack comprising:
power converters including a switch, a storage system, and a gate drive, said gate drive communicating with a controller;
a plurality of contactors, said contactors also communicating with said controller, and being operable to be changed by said controller to communicate said power converters to magnetic components; and
said magnetic components communicating with a plurality of motors, said controller being operable to change a configuration of said contactors to reconfigure how power is supplied to the magnetic components from said power converters.

13. The power electronics rack as set forth in claim 12, wherein said contactors can selectively connect a switch directly to a first lower power motor, and can combine a plurality of the switches to a single, larger motor to provide adequate power.

14. A method of operating a power electronics rack comprising the steps of:
providing a plurality of power converters including switches for supplying power, said power converters being connected through contactors, with said contactors being able to be controlled to change a downstream direction for power from said power converters, magnetic components being positioned downstream of said contactors, with said magnetic components communicating with a plurality of motors; and
a configuration of the contactors being changed to change the supply of power from the power converters to the plurality of motors.

15. The method as set forth in claim 14, wherein said contactors selectively connect a power converter directly to a first lower power motor, and can combine a plurality of the power converters to a single, larger motor to provide adequate power.

* * * * *